United States Patent
Kawashima et al.

[11] Patent Number: 5,604,886
[45] Date of Patent: Feb. 18, 1997

[54] DESIGN SUPPORTING APPARATUS AND METHOD FOR PERFORMING DESIGN WORK AT EACH OF A PLURALITY OF DESIGN STAGES

[75] Inventors: Yasumasa Kawashima; Shiro Nonaka; Shinji Tokumasu; Takayuki Ishikawa, all of Hitachi, Japan

[73] Assignee: Hitachi, Ltd., Tokyo, Japan

[21] Appl. No.: 834,352

[22] Filed: Feb. 12, 1992

[30] Foreign Application Priority Data

Feb. 13, 1991 [JP] Japan .................................. 3-019742

[51] Int. Cl.⁶ ....................................................... G06F 17/00
[52] U.S. Cl. .......................... 395/500; 395/615; 395/326; 364/DIG. 1; 364/DIG. 2
[58] Field of Search ..................................... 395/500, 155, 395/600, 919; 364/512, 468

[56] References Cited

U.S. PATENT DOCUMENTS

| | | | |
|---|---|---|---|
| 4,451,895 | 5/1984 | Sliwkowski | 395/155 |
| 4,858,146 | 8/1989 | Shebini | 364/512 |
| 5,019,992 | 5/1991 | Brown et al. | 364/468 |
| 5,051,898 | 9/1991 | Wright et al. | 395/600 |
| 5,249,135 | 9/1993 | Fujita | 395/919 |
| 5,255,207 | 10/1993 | Cornwell | 364/512 |
| 5,267,146 | 11/1993 | Shimizu et al. | 395/919 |
| 5,313,561 | 5/1994 | Nishizawa et al. | 395/919 |
| 5,321,620 | 6/1994 | Tanaka et al. | 395/919 |
| 5,359,523 | 10/1994 | Talbott et al. | 395/919 |
| 5,371,845 | 12/1994 | Newell et al. | 395/919 |

*Primary Examiner*—Robert B. Harrell
*Assistant Examiner*—Zarni Maung
*Attorney, Agent, or Firm*—Antonelli, Terry, Stout & Kraus, LLP

[57] ABSTRACT

The design work is to perform various investigation for design data while displaying it on a display screen to make subdivision and concretization thereof. Thus, the design work is a combination of a plurality of design stages in general. Accordingly, the design work is described for each design stage to improve work efficiency. Actually, a design supporting apparatus includes a device for setting the design stages clearly, a device for preserving the setting, a device for setting relation between the design stages, a device for deciding the design stages dynamically, and a device for relating the design data to the design stages for preservation thereof in addition to processing and editing function of the design data provided in the design supporting apparatus.

33 Claims, 11 Drawing Sheets

FIG. 5

```
         DESIGN DATA DISPLAY
         PROCESS DESIGNATION MENU

● FIELD OF    ☐ WHOLE
  VISION      ☐ COMPONENT (_____)
              ☐ POSITION (X___ Y___ Z___)

● ABSTRACTION  ☐ SYMBOL      ☐ ANALYSIS
               ☐ FRAMEWORK   ☐ PROCESSING
               ☐ EXTERNAL    ☐ USER'S DEFINITION
                 APPEAR-
                 ANCE

● DIRECTION    ☐ THREE-ORTHOGRAPH
               ☐ PERSPECTIVE
                 VIEW
                   (POINT OF VIEW___ DIRECTION OF VIEW___)
```
~126

FIG. 6

```
         EDITING PROCESSING DESIGNATION MENU

● SELECTION OF SYSTEM      ☐ ALL
  COMMAND                  ○ COMMAND A  ▲
                             COMMAND B
                           ○ COMMAND C
                             COMMAND D  ▼
                           ○ COMMAND E

● ADDITION OF USER COMMAND  ☐ NO
                            ☐ YES
                              (_____)

● DEMON PROCESS             ☐ NO
                            ☐ YES
                              (_____)
```
~127

FIG. 7

```
┌─────────────────────────────────────────────────┐
│        INTER-STAGE RELATION DESIGNATION MENU    │
│        ───────────────────────────────────      │
│                                                 │
│                                                 │
│   ● STAGE OF       (_____)            │
│     INTEREST       □ AUTOMATIC  □ MANUAL        │
│                      SETTING                    │
│                                                 │
│                                                 │
│   ● ORDER          □ PAVALLEL   □ INCLUSION     │
│     ATTRIBUTE      □ PRECEDENT  □ SUBSEQUENT    │
│                                                 │
│                                                 │
└─────────────────────────────────────────────────┘
                                               ╲
                                               128
```

DESIGN SUPPORTING APPARATUS AND METHOD FOR PERFORMING DESIGN WORK AT EACH OF A PLURALITY OF DESIGN STAGES

BACKGROUND OF THE INVENTION

The present invention relates to a design supporting apparatus and method, and more particularly to a design supporting apparatus and method for supporting design work including a plurality of design stages.

In a conventional design supporting apparatus and method, the design stages of the design work are treated as follows.

(1) General-Purpose Design Supporting Apparatus and Method

The general-purpose design supporting apparatus and method do not treat the design stages clearly. However, command hierarchies serve in a similar manner thereto. That is, when a certain command hierarchy is selected, a subsequent editing process is limited and a sectional operation for an object can be performed. The editing process can be customized by means of a macro or link of the user programs. An example of such general-purpose design supporting apparatus and method is described in a program product known as "USER INTERFACE OF A DRAFTING SYSTEM HICAD/DRAFT/W" of Hitachi Engineering Work Station 2050G issued July, 1988, PP 1–5.

(2) Problem-Oriented Design Supporting Apparatus and Method

The problem-oriented design supporting apparatus and method are intended to solve a problem such as, for example, provision of dimensions or material in response to a predetermined input. In the problem-oriented design supporting apparatus and method, the design stage of "to solve a specific problem" is previously set and the design stage is further developed to partial design stages. The partial design stages include a display process and an editing process of inherent design data, and the user can advance the design by dealing with the design stages which are displayed as several pictures in succession. However, the developing method for the partial design stages is fixed to a previously provided system. As an example of the problem-oriented design supporting apparatus and method, there is a mechanical structure computation system MSTR described in a catalog for mail order entitled "FACE AUTOMATIC MACHINE" of MISUMI Co., Ltd., pages 763–764, issued August, 1990.

(3) Knowledge-Based Design Supporting Apparatus and Method

The knowledge-based design supporting apparatus and method express the design stage as a set of inherent knowledges. A method of describing the design stages by means of five kinds of knowledge is described in, for example, the fourth page of an article entitled "DESIGN SHELL: A FORMALISM FOR PROTOTYPE REFINEMENT IN KNOWLEDGE-BASED DESIGN SYSTEM", Artificial Intelligence in Engineering, Vol. 5, No. 1, pages 2–8, issued January, 1990. However, the structural description of the design stages is static and means for adding a new design stage during the course of operation is not taken into consideration. Further, there is no description of a display process of the design data at each of the design stages and an actual utilization method of the five kinds of knowledge.

The present invention is intended to solve certain problems included in the conventional design supporting apparatus and method, which problems will be now described below.

(1) Problem of Dynamic Modification of Design Stages

In the case of the problem-oriented design supporting apparatus, as shown in FIG. 12, a series of design stages necessary for a design are adapted and an integrated system having a picture layout and processes corresponding to respective design stages is constructed. However, in an actual design of a product, as shown in FIG. 13, it is necessary to select new parameters in the design stage of the design work and design stages are added and modified in accordance with the selected parameters. The addition and modification of the design stages are carried out to advance the design work by utilizing other measures, for example, a desk-top calculator. Accordingly, the design work is very complicated.

(2) Problem of Representation Capability of Design Stages

In general, in order to perform work efficiently, the design is required to be performed in consideration of "when", "what is an object" and "what to do". More particularly, as shown in FIG. 14, it is necessary to divide objects to be designed and design tools (editing commands) into those necessary for the work at that time and others. Further, the object to be designed is required to be converted to data in order to be able to make it work. However, command customized information in a general-purpose design supporting apparatus describes only "what to do" independently of "when" and since the user or an event driven process also refers to unnecessary information, the work efficiency is reduced. In the case of the knowledge-based design supporting apparatus, since there is no display processing method of design data available to the user, there is a problem the the work efficiency is reduced similarly.

(3) Dependence Relation of Design Stages

The work in each of the design stages is not determined only by the design stage thereof and is varied in accordance with precedent design stages. The prior art does not take this point into consideration and lacks flexibility.

(4) Continuity of Design Stages

The continuity in the case where the work is once interrupted and is then resumed is not obtained only by the command customized information and static information and the user is required to prepare the design stage again. Further, similarity of the design work relating to a plurality of design data is not considered.

SUMMARY OF THE INVENTION

It is an object of the present invention to provide a design supporting apparatus and method which are capable of reducing the problem of dynamic modification of design stages which is part of the design work, preparing a new design stage even if the design is at an advanced stage and coping with a change of the design work.

It is another object of the present invention to provide a design supporting apparatus and method which are capable of improving the display capability of the design. stages.

It is a further object of the present invention to provide a design supporting apparatus and method which are capable of reducing the problem of dependence relation resulting from the fact that precedent design stages influence a current design stage.

It is a still further object of the present invention to provide a design supporting apparatus and method capable of improving the continuity of the design stages between the precedent design stages in the case where the design work is interrupted and then resumed.

According to a first aspect of an embodiment, the design supporting apparatus for supporting design work including a plurality of design stages, comprises:

a memory device for storing design data;

an input device for inputting editing process information indicative of a group of tools for editing the design data in at least one of the plurality of design stages; and an output device for outputting the design data on the basis of the editing process information corresponding to the at least one design stage.

According to a second aspect of an embodiment, the design supporting apparatus for supporting design work including a plurality of design stages, comprises:

a memory device for storing design data;

an input device for inputting editing process information indicative of an editing form of the design data in at least one of the plurality of design stages; and a display device for displaying the design data and the editing process information on a display screen correspondence to the at least one design stage.

According to a third aspect of an embodiment, the design supporting apparatus for supporting design work including a plurality of design stages, comprises:

a memory device for storing design data;

an input device for inputting inter-stage relation information indicative of an attribute relation between at least partial design stages of the plurality of design stages; and an output device for outputting the design data on the basis of said inter-stage relation information correspondence to said at least one design stage.

More particularly, the problems of the dynamic modification and the representation capability of the design stages are solved by the provision of at least one of a device for setting a new design stage by designating the display process and the editing process of the design data inherent to the new design stage, a design stage setting file for storing the display process and the editing process of the design data inherent to the design stage for a plurality of design stages, a device for setting one or more areas on the display screen to associate each of the areas to one design stage, a device for visualizing the editing process of the design data inherent to the design stage, a command for controlling the arrangement of the design stage, and a command for effecting processing in each of the design stages to control editing work.

The representation capability of the design stages is implemented by the provision of at least one process of a limitation process of constituent elements of the design data, a spatial limitation process of the design data, an abstracting process of the design data, and a projection converting process of the design data in the design stage in addition to the display process of the design data inherent to the design stage.

Similarly, the designating method of the editing process of the design data inherent to the design stage is implemented by the provision of at least one of a selection of part of various commands provided by the design supporting apparatus and method, addition of a new command other than the commands provided by the design supporting apparatus and method, and setting and deletion of an event driven process for performing a predetermined processing and editing in accordance with a condition of the design data.

Further, with regard to the problem of the dependence relation of the design stages, in order to implement the display process and the editing process of the design data, there is provided at least one of a device for making a decision by using an order relation of the plurality of design stages implemented precedently and definition information of a current design stage, a device for setting a relation having a predetermined attribute between the design stages and making a decision by using an attribute of a relation between the design stages implemented just before and the definition information of the current design stage, and a device for selecting a design stage subsequent to the current design stage on the basis of the relation attribute between the design stages.

Finally, the problem of the continuity of work is solved by the provision of at least one of a work procedure file for storing identification information of the plurality of design data, setting information of a design stage group required to process and edit each of the identification information and relation attribute between the design stages related to each other, a device for storing the editing processing result of the design data for each of the design stages in the work procedure file, a device for referring to, reproducing and deleting the identification information of one design data, setting information of the design stage group relating to the identification information and the editing processing result for each of the relation attribute design stages in the work procedure file collectively, a device for retrieving the design stage necessary for the design work from the work procedure file by designating the identification information or a classification of the design data, and a device for retrieving the design data requiring the design stage from the work procedure file by designating a specific design stage. Further, in the utilization method of these devices, when the processing and editing work of the new design data is performed, the definition information, the relation attribute and the editing processing result of the design stage relating to other design data are reproduced from the work procedure file.

Since the output processing information indicative of the output form of the design data in at least one of the plurality of design stages is inputted and the design data is outputted on the basis of the output processing information correspondingly to the at least one design stage, the problem of the dynamic modification of the design stage can be reduced, even though the design work is changed, the currently used design supporting apparatus can be used.

Since the editing processing information indicative of the editing form of the design data in at least one of the plurality of design stages and the design data and the editing processing information are displayed on the display screen correspondence to the at least one design stage, the problem of the dynamic modification of the design stage can be reduced and a new design stage can be produced, a change of the design work being capable of being treated.

Since the inter-stage relation information indicative of the attribute relation between at least partial design stages of the plurality of design stages is inputted and the design data is outputted on the basis of the inter-stage relation information in correspondence to the at least one design stage, the problem of the dependence relation can be reduced.

BRIEF DESCRIPTION OF THE DRAWINGS

FIG. 5 illustrates an example of a design data display processing designation menu;

FIG. 6 illustrates an example of an editing processing designation menu;

FIG. 7 illustrates an example of an inter-stage relation designation menu;

DESCRIPTION OF THE PREFERRED EMBODIMENTS

First of all, the features of the present invention now will be described with reference to FIG. 2 in order to facilitate the understanding of the present invention.

Figure 2:
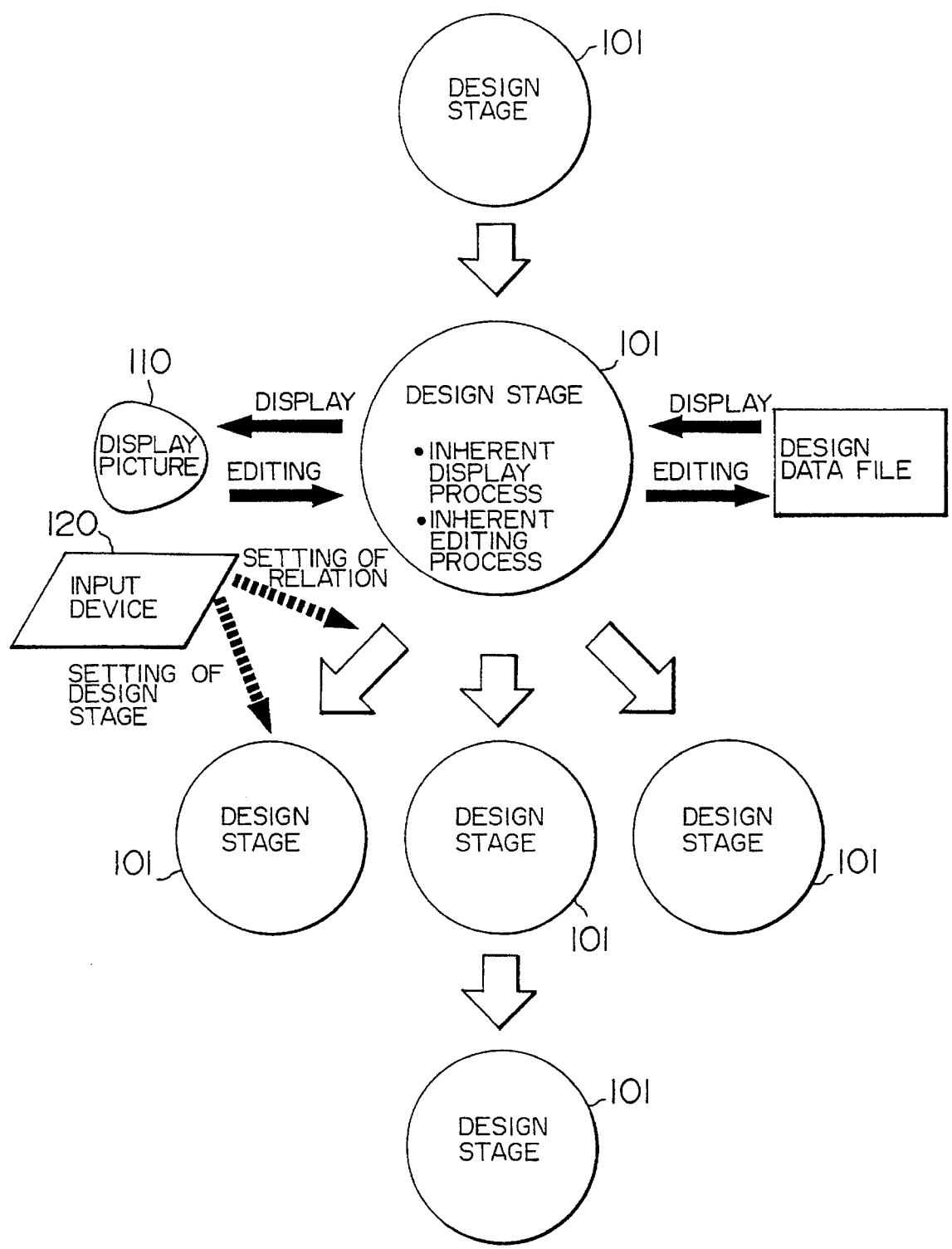
FIG. 2 schematically illustrates the principle indicative of design procedure according to the present invention.

FIG. 2 schematically illustrates a principle showing the relation of design work and the present invention.

Design work for an industrial robot as a product, for example, is a set of a plurality of design stages 101 related to each other. The principle of the present invention resides in that a new design stage 101 is set from a data input device 120 interlocked with a display screen 110 of a display device constituting an output device when the design work is made in a certain design stage 101. Consequently, each of the design stages has an inherent display process and editing process as an attribute thereof. In this manner, when the new design stage is set by means of the data input device interlocked with the display screen for performing processing and editing work, the new design stage can be started even under processing and editing work of the design data to accordingly cope with a change of the design work.

On the other hand, when the display process is designated as the setting information of the design stage 101, since only necessary information in the current design stage of information included in the design data is taken out, the user is not required to refer to extra information and the work efficiency is improved. Further, since the designation of the editing process limits that it can be made by the current design stage 101 and the work is clarified, the efficiency is improved.

Similarly, when a design stage setting file (140 shown in FIG. 1) is provided, a new design stage 101 is easily set by referring to the existing design stage setting information. Further, when there are provided a display processing device for setting a plurality of areas on the display screen 110 to associate each of the areas with one design stage 101, an editing processing device for visualizing the editing process of the design data inherent to the design stage 101, a command for controlling arrangement of the design stages 101, and a command for processing in each of the design stages 101 to perform editing work, work in each of the design stages 101 is presented to the user visually and accordingly the work efficiency is further improved.

With regard to the representation capability of the design stage 101, when a limitation process of constituent elements of the design data, a spatial limitation process of the design data, an abstracting process of the design data, and a projection converting process of the design data in the design stage 101 are included in the display process of the design data inherent to the design stages 101, a target of each of the design stages 101, for example, the display process of the design data in accordance with operation of a hierarchical structure of components constituting a product, spatial arrangement operation or relational operation of geometric shape and symbolized function can be designated, and accordingly the effect that it is not necessary to refer to extra information with respect to the design data is further enhanced.

Similarly, when implementation of selection of part of various commands provided by the design supporting apparatus, implementation of addition of a new command other than the commands provided by the design supporting apparatus and method, and implementation of setting and deletion of an event driven process for performing a predetermined processing and editing in accordance with a condition of the design data are provided as the designating method of the editing process of the design data inherent to the design stage 101, only a necessary command in the design stage 101 is presented to the user or only a necessary event driven process is operated, and accordingly the work efficiency is further improved.

Further, with regard to the dependence relation of the design stages 101, when there are provided a device for making a decision by using an order relation of the plurality of design stages 101 implemented precedently and current design stage setting information, a device for setting a relation having a predetermined attribute between the design stages 101 and for making a decision by using an attribute of the relation between the current design stage 101 and the design stages 101 implemented just before and the design stage setting information, and a device for selecting the design stage 101 subsequent to the current design stage 101 on the basis of the relation attribute between the design stages for the purpose of the display process and the editing process of the design data, the final display process and editing process are dynamically decided in consideration of a result of the precedent design stage 101 and a combination with the current design stage 101 in addition to setting of individual design stage 101, and accordingly the dependence relation of the design stages 101 can be reflected.

Finally, with regard to the continuity of work, by providing setting information of a group of design stages 101 for processing and editing the design data, a work procedure file for storing a relation attribute between the design stages 101 related to each other, and a device for storing an editing process result of the design data for each design stage 101 in the work procedure file, since a state of the design data upon interruption of work in each of the design stages 101 is preserved, the continuity for the interruption and resumption is maintained.

Further, when there are provided a device for referring to, reproducing and deleting the definition information of a group of the design stage 101 relating to one design data and the relation attribute editing processing result in the work procedure file collectively, a device for retrieving the design stage 101 necessary for processing and editing of the design data by designating the specific design data or a classification thereof, and a device for retrieving the design data requiring the design stage 101 by designating a specific design stage 101, the design stage 101 for a new design data and the relation attribute can be set by referring to the work for the past design data and since the editing processing result of the past design data can be utilized, long-term continuity is maintained.

An embodiment of the present invention will now be described in detail.

Figure 1:
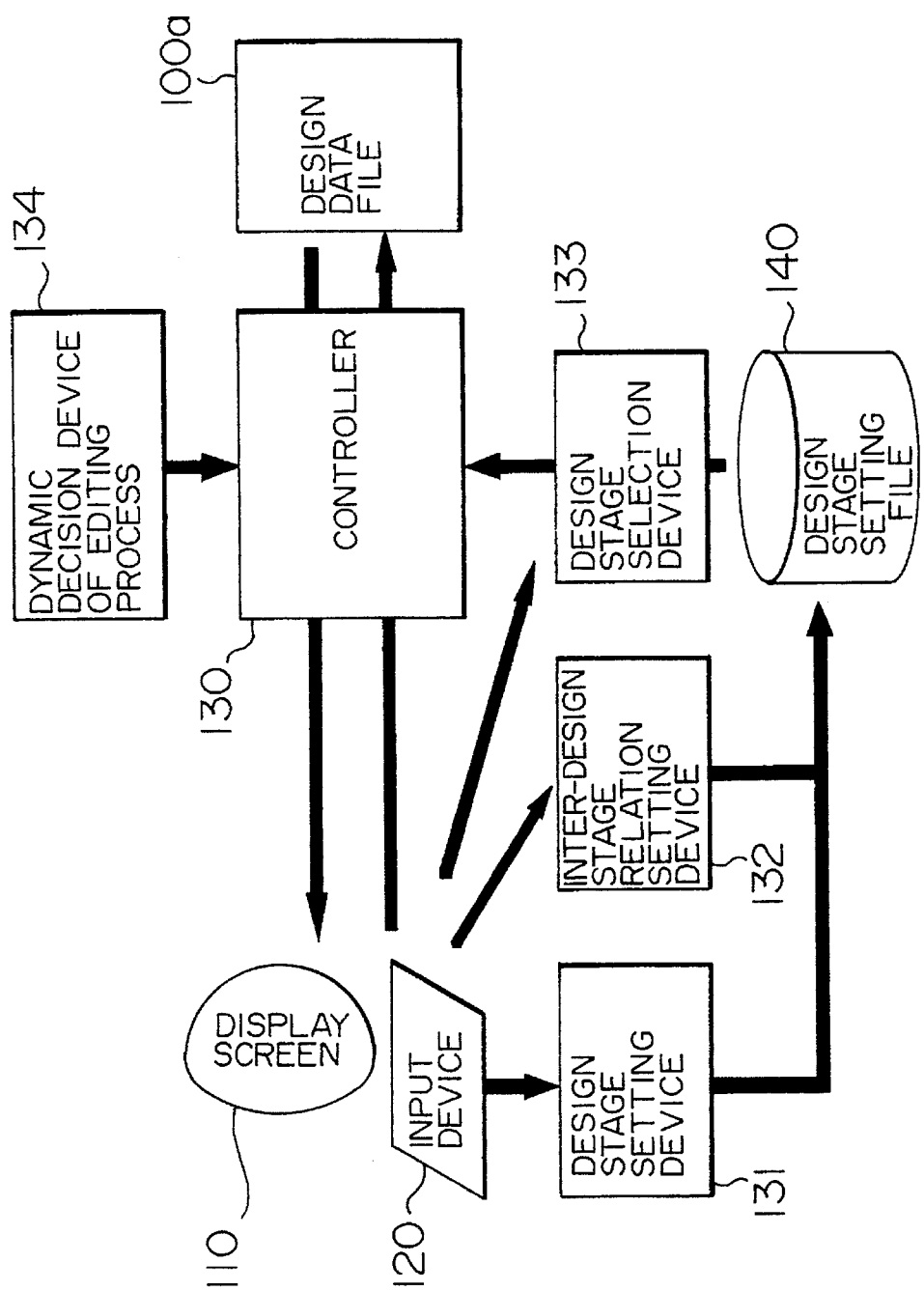
FIG. 1 is a block diagram showing a basic configuration of a design supporting apparatus according to the present invention.

FIG. 1 is a block diagram showing a basic configuration of a design supporting apparatus according to an embodiment of the present invention. The user processes and edits design data stored in a design data file 100*a* by means of a display screen 110 of a display device, such as a CRT, a liquid crystal display or the like and a data input device 120, such as a mouse, a key board, a hand-written input device or the like, while display processing and editing processing in this case are carried out a controller 130. There are two operations for determining the display processing and the editing processing in the controller 130.

Reference is made to contents of the design stage from the design stage setting file 140 in response to designation by the user, and this is carried out by a design stage selection device 133. The contents of the design stage are stored in the design stage setting file 140 by means of a design stage setting device 131 which has received a command from the data input device 120 interlocked with the display screen 10. In the embodiment, display processing information, editing processing information, and the like, constituting definition information of the design stage and relation information between the design stages, are stored in the design stage definition file 140. Storing of a relation attribute is made by an inter-design stage relation setting device 132.

A further operation for deciding the display processing and/or editing processing in the controller 130 is made by a dynamic decision device 134 for display processing and/or editing processing. The display and editing processing dynamic decision device 134 changes display and editing processing of the current design stage by using an order relation of the plurality of design stages precedently implemented or a relation attribute between design stages implemented just before.

Figure 11:
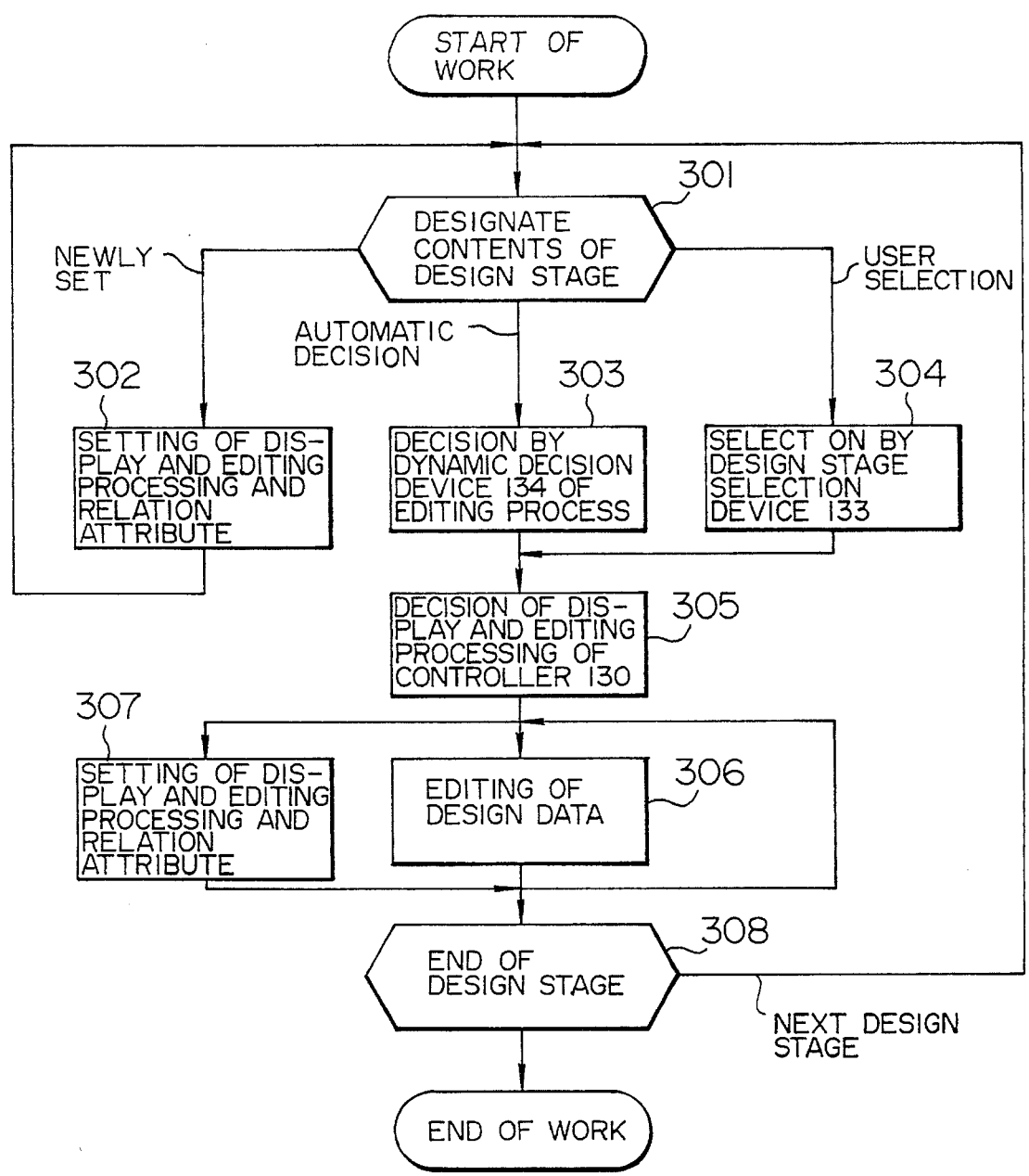
FIG. 11 is a flow chart showing setting of design stages of the design supporting apparatus.
Figure 12:
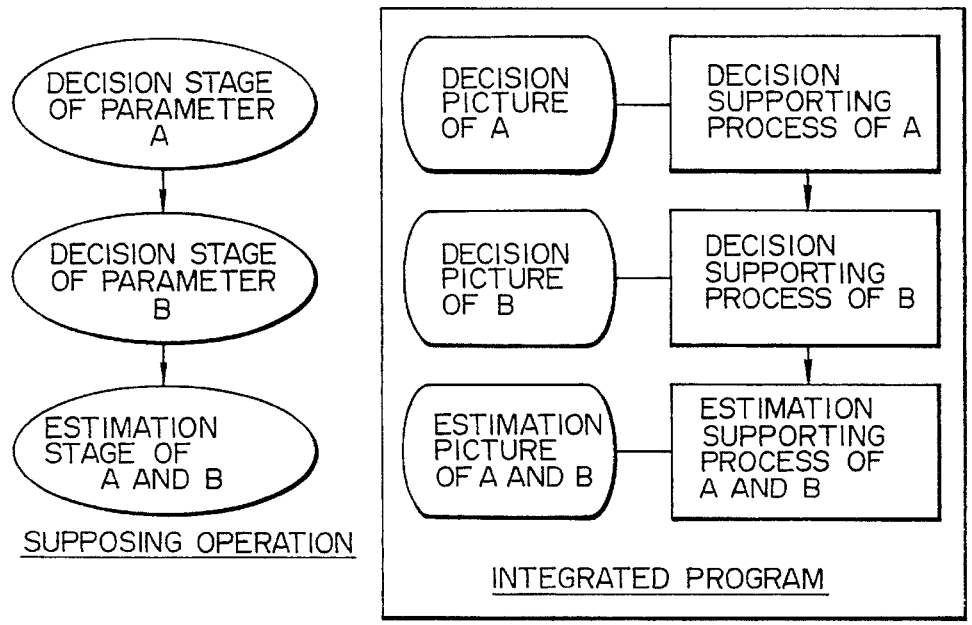
FIGS. 12 to 14 are diagrams for explaining operation of a conventional design supporting apparatus.
Figure 13:
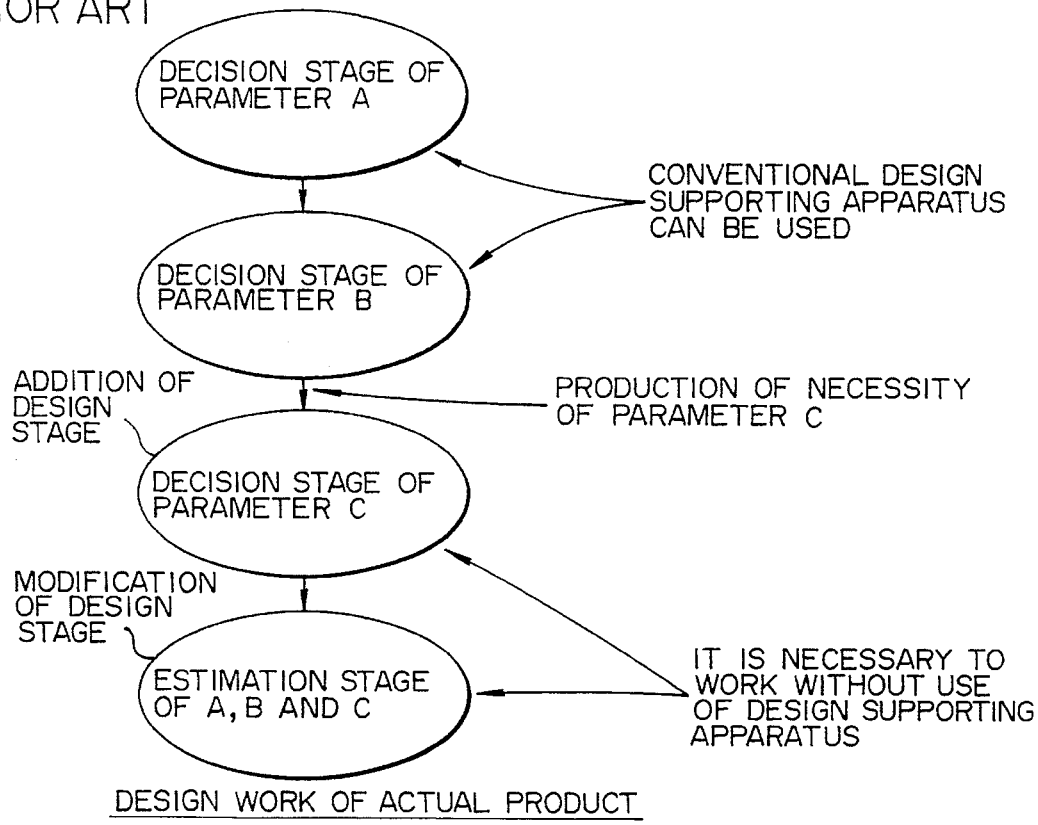
Figure 14:
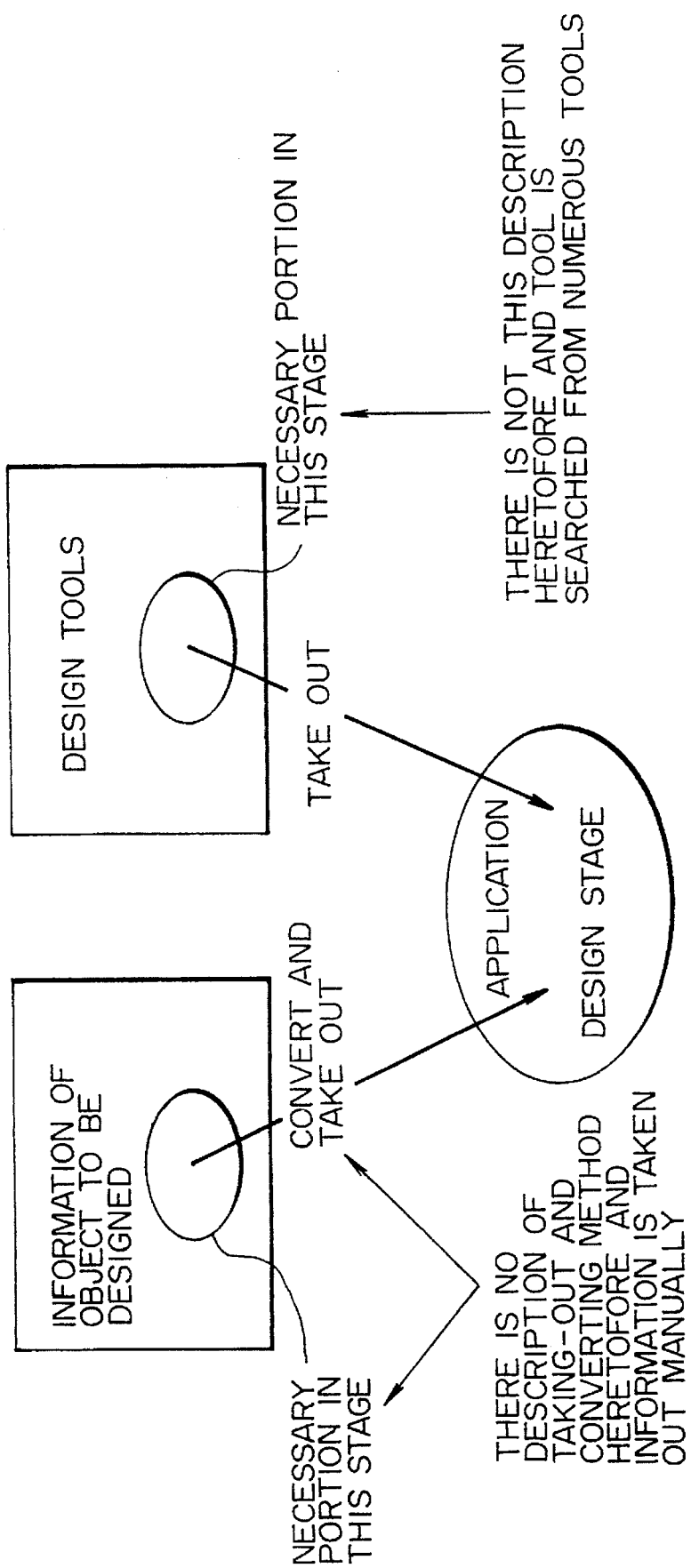

Operation of the design supporting apparatus shown in FIG. 1 will now be described with reference to the flow chart shown in FIG. 11. In step 301, contents of the design stage constituting part of the design work are designated by the user. For example, design data used in the design stage is designated. The design stage is set at any of steps 302, 303 and 304, that is, it is set newly in step 302 or it is set by the editing processing dynamic decision device 134 automatically in step 303, or it is selected by the design stage selection device 133 in accordance with the designation of the user in step 304. The contents of the design stage selected in any step include display information for the display screen and the editing format thereof determined by the controller 130 in step 305. In step 306, the user edits the design data match to the design contents. The design data edited at this time can be related to other design data in step 307. When editing of the design data is completed, setting of the design stage is finished in step 308 and the process proceeds to setting of a next design stage.

Figure 3:
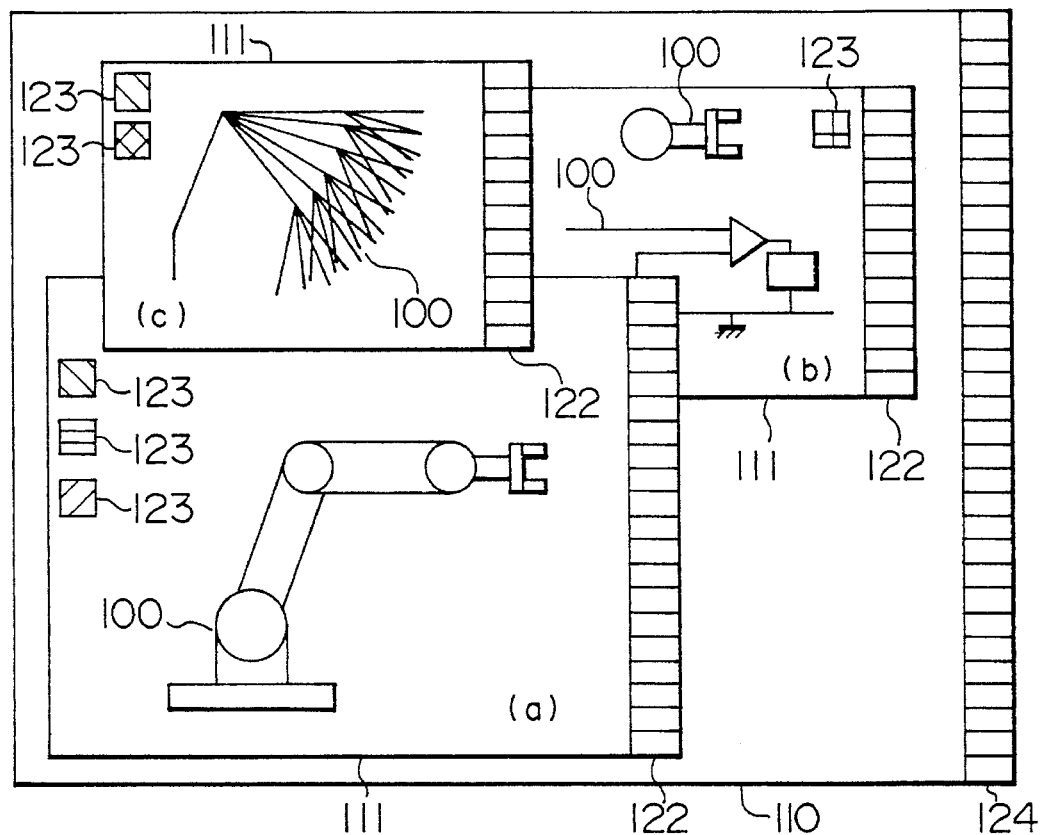
FIG. 3 illustrates a layout of a display screen.

FIG. 3 shows a layout of a display screen of the design supporting apparatus in this embodiment. The whole of FIG. 3 is one display screen 110 and there are a design stage control menu 124 and a plurality of design stage corresponding areas 111 in the display screen 110. The design stage control menu 124 visualizes commands for controlling and editing the design stage 101 and the user can use the design stage control menu 124 to set, select, delete and reproduce the design stage 101, Each of the design stage corresponding areas 111 corresponds to one design stage 101. In the design stage corresponding areas 111 there are shown design data 100 processed by a specific display processing, design data processing and editing menus 122 as well as driven process control icons 123. The design data processing and editing menu 122 is a set of commands for processing and editing the design data 100 in the same manner as a command menu of a conventional design supporting apparatus and is characterized in that a different menu is displayed in each of the design stage corresponding areas 111 on the basis of the design stage setting information transmitted from the input device 120 to the work stage setting device 131, as shown in FIG. 1. In this way, by displaying the design data processing and editing menu 122, the user can understand the contents of each of the design stages 101 clearly. The event driven process control icon 123 monitors the design data 100 and the user's action in the design stage 101 and is an icon corresponding to the event driven process which operates in accordance with a produced event, To display an icon of demon process has an effect that the contents of the design stage 101 are made clear similarly to a display of the menu. The demon process is described in detail in, for example, "Iwanami Koza Information Engineering 22 Artificial Intelligence, pages 150–160, Chapter 7, 2, "Demon", Mar. 26, 1987, 5th Issue".

The design stage corresponding areas 111 are overlapped so that a design stage 101 which must be implemented at each time is disposed uppermost and a design stage 101 to be implemented subsequently thereto is disposed thereunder and so on.

The design stage corresponding areas 111 shown in FIG. 3 are set by a menu shown in a design stage setting menu 125 of FIGS. 4 to 7 displayed on the display screen 110 in the setting mode.

Figure 4:
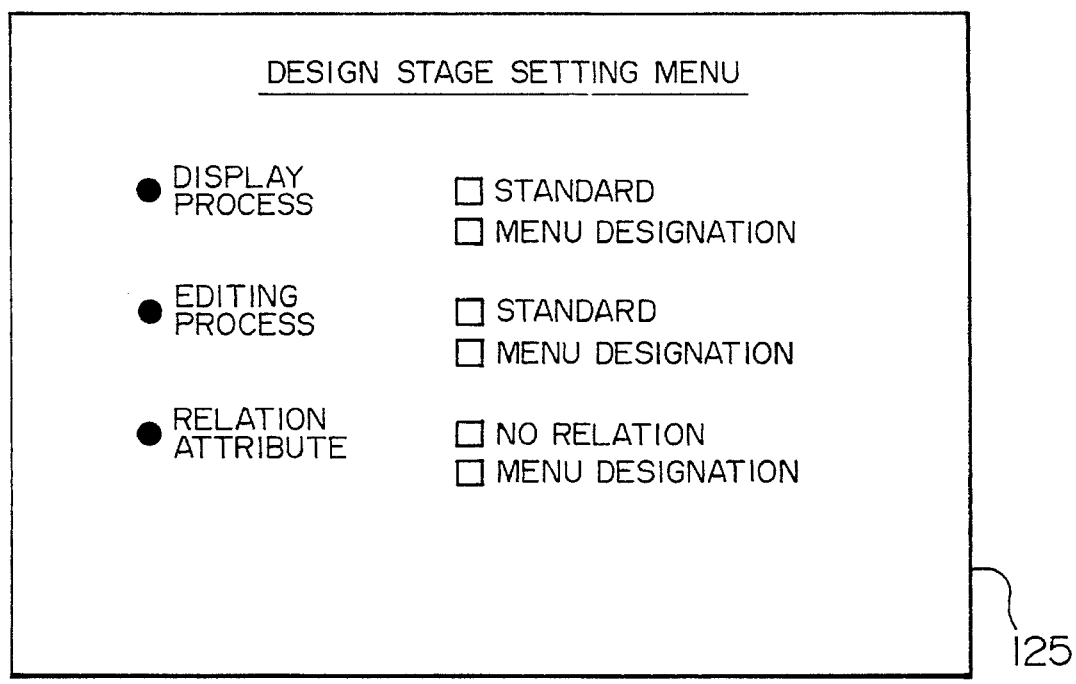
FIG. 4 illustrates an example of a design stage setting menu.

The design stage setting menu 125 of FIG. 4 appears when a setting command of a new design stage is designated in the design stage control menu 124 shown in FIG. 3 and shows items necessary for setting of the design stage 101, FIGS. 5, 6 and 7 show the design stage setting menus 125, each of which appears when the "setting of menu" is selected in items of "display processing", "editing processing" and "relation attribute". The display processing designation menu 126 of FIG. 5 designates a field of vision, an abstraction and a three-dimensional projection direction of the design data constituting the display processing information. The editing processing designation menu 127 of FIG. 6 displays editing processing information, such as selection of a necessary command from commands previously provided in the design supporting apparatus, addition and input of a new command by the user, operator or the like, and selection of a necessary demon process. An inter-stage relation designation menu 128 of FIG. 7 designates another design stage constituting inter-stage relation information to designate an order relation to the defined design stages.

Utilization examples of the menus with respect to the design stage corresponding areas 111(*a*), (*b*) and (*c*) of FIG. 3 now will be described. In the display processing designation menu 126, the term "whole" is designated for the "field of vision", the phrase "external appearance" for the "abstraction" and the term "three-orthograph" for the "direction" with respect to the design stage 101 corresponding to the design stage corresponding area 111(*b*), and consequently the whole external appearance is displayed as shown in FIG. 3. Similarly, in the design stage corresponding area 111(c), the term "framework" is designated as the "abstraction" and in the design stage corresponding area 111(a), the phrase "holding portion" is designated as the "field of vision" and the term "analysis" is designated as the "abstraction". In the editing processing designation menu 127, a different command and the demon process correspond to the design stages are specified. Consequently, the design data processing and editing menu 122 and the event driven process control icon 123 are displayed in the design stage corresponding areas 111. Further, in the relation designation menu 128, the design stage corresponding areas 111(c), 111(a) and 111(b) are set to have priorities which are higher in order of description thereof and are displayed on the display screen of the display device as shown in FIG. 3.

Figure 8:
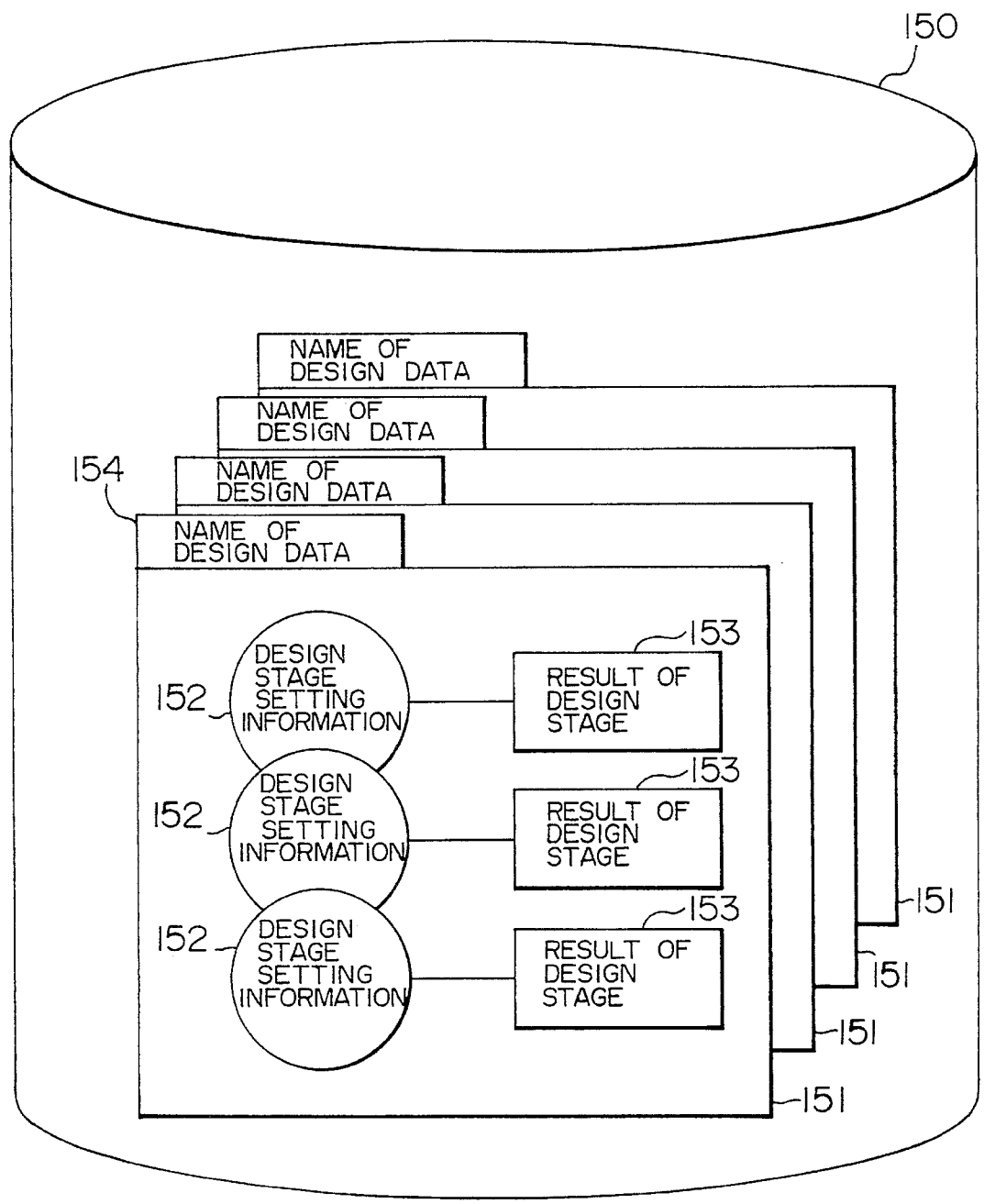
FIG. 8 schematically illustrates a configuration of a work procedure file.

FIG. 8 shows an embodiment of the work procedure file, which is a feature of the present invention. That is, the work procedure file 150 includes a plurality of work procedure data 151 and each of the work procedure data 151 includes a plurality of design stage setting information 152 and a plurality of results of the design stages 101 collected in relation to a design data name 154. The work procedure file 150 is a memory and will be described in detail with reference to FIG. 10.

Figure 9:
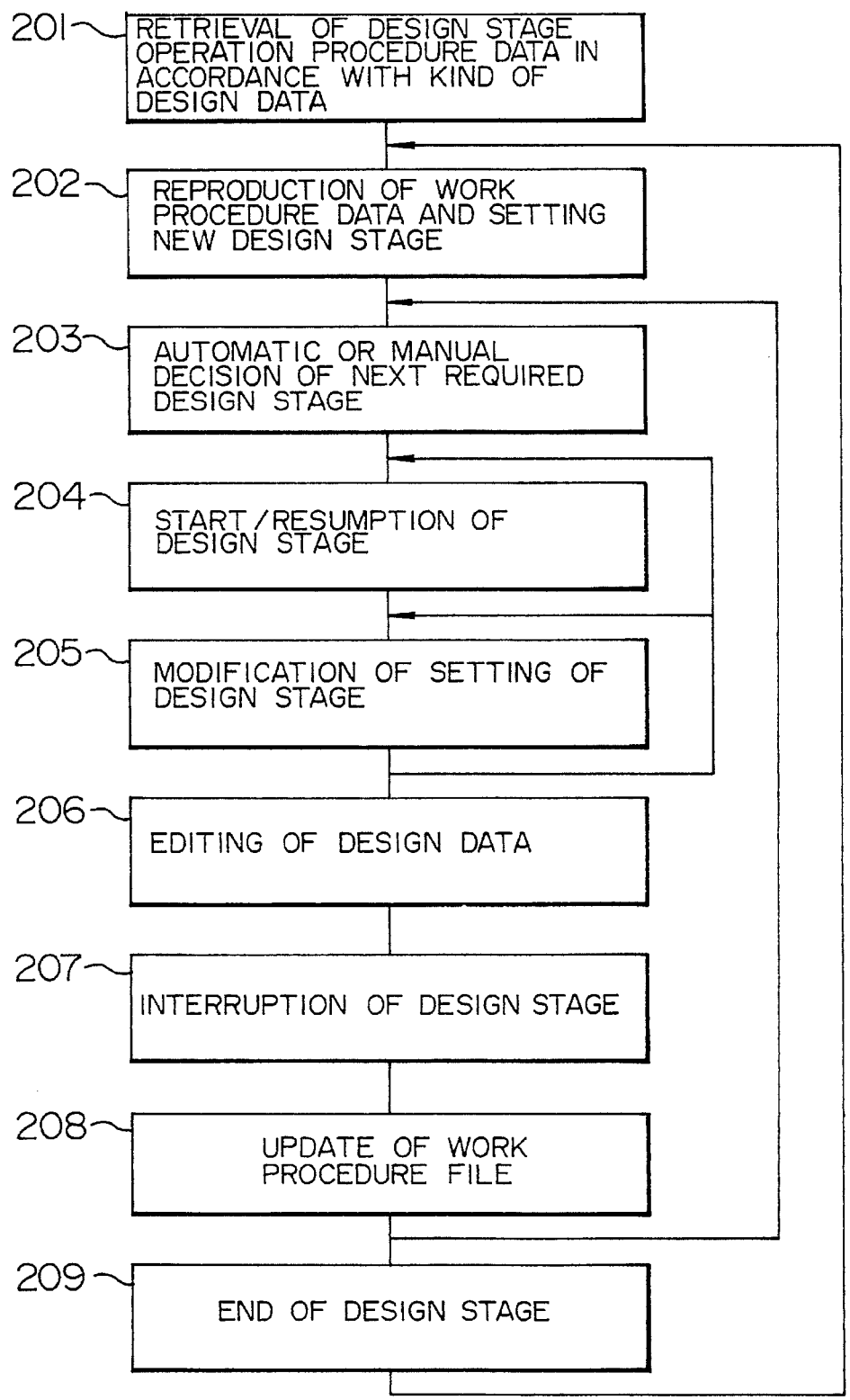
FIG. 9 is a flow chart showing a procedure of design work utilizing the work procedure file.

With the provision of the work procedure file 150, the design work shown in FIG. 9 can be implemented. More particularly, in step 201 of FIG. 9, in order to establish the work procedure for a new design data, the work procedure data 151 relating to the same kind of design data 100 is retrieved from the work procedure file 150. In step 202, the obtained work procedure data 151 is reproduced to provide for modification of the work procedure data 151. It is characterized that the processed and edited results of old design data 100 for each of the design stages are reproduced together with the reproduction of the work procedure data 151.

Accordingly, the user can implement the work in each of the design stages while referring to the old design data 100. In step 203, one design stage of the reproduced work procedure data 151 is selected. This is performed by the design stage selection device 133 shown in FIG. 1. In step 204, the selected design stage is started. In steps 205 and 206, setting of the current or future design stage and processing and editing operation of the design data 100, which is an inherent object, are carried out, respectively. Both steps occur in operation of one design stage 101 and are repeated. Step 207 involves interruption of one design stage and represents a state in which resumption in the step 204 is expected. In step 208, the work procedure data 151 is updated and the updating is effected automatically in order to preserve the interrupted state. When the object of the design stage 101 is attained, the operation of FIG. 9 is finished in step 209. If the design stage 203 is a final stage, the design work itself is finished. If not, the process is returned to the step 203 and the next design stage 101 is selected. The description of FIG. 9 has been presented so that all of the design stages 101 are processed in sequence, however the design stages 101 may be processed in parallel, as shown in FIG. 2.

Figure 10:
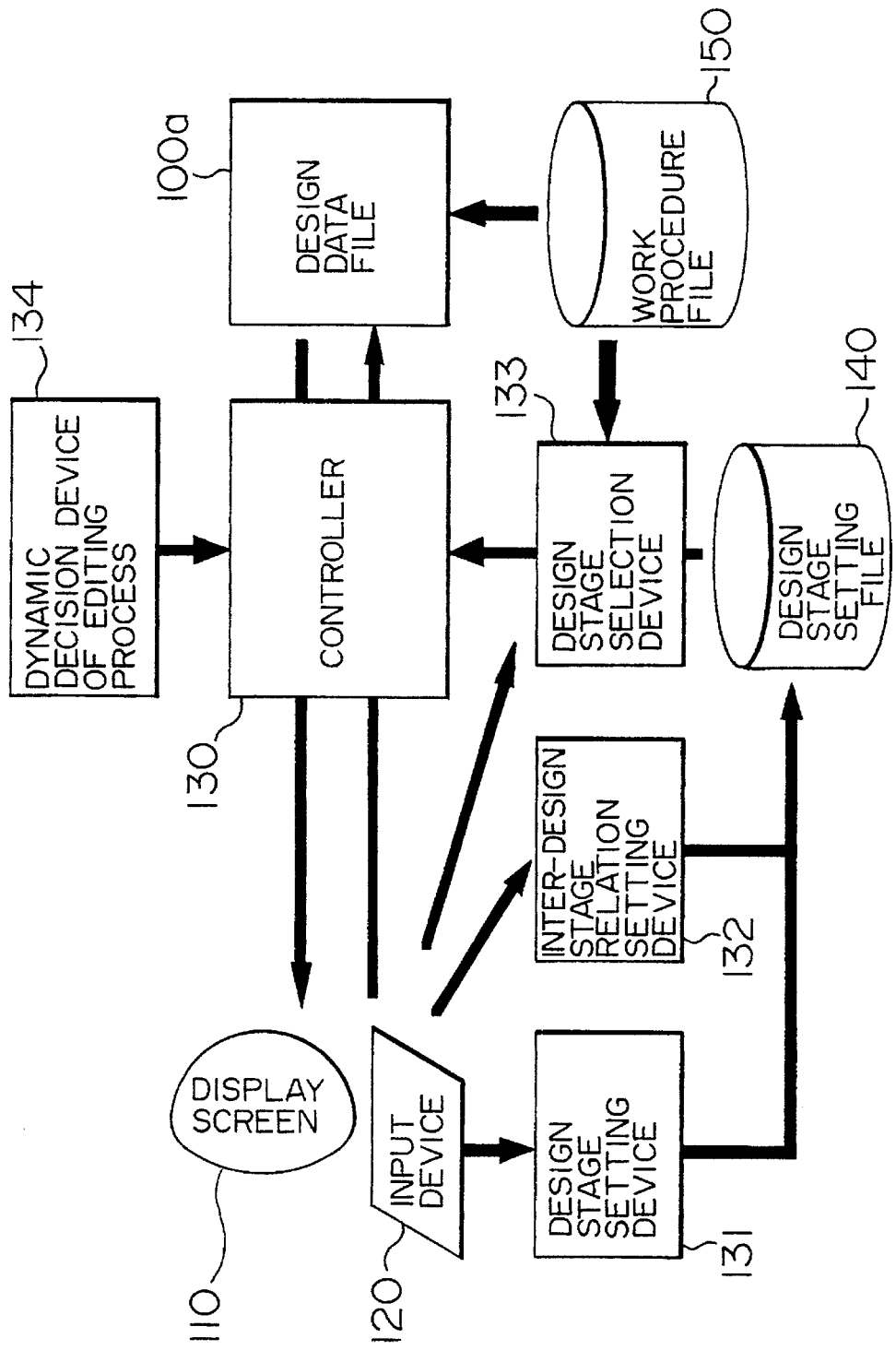
FIG. 10 is a block diagram showing another basic configuration of a design supporting apparatus according to the present invention.

FIG. 10 is a block diagram showing another embodiment of the present invention. This embodiment shows a system configuration having a work procedure file 150 added to the embodiment of FIG. 1. That is, the work procedure file 150 is connected to the design stage selection device 133 and provides setting information for the design stage 101 and the old design data in accordance with the flow of the process shown in FIG. 9.

According to the embodiments of the present invention, the following effects are attained.

Since the new design stage can be started even in the processing and editing operations of the design data, the apparatus can cope with a change of the design work.

Since the display process and the editing process suitable for the design stage can be set, there is no reference to extra information and the work efficiency is improved.

A new design stage is easily set by the design stage setting file.

Since the work at each of the design stages is presented to the user clearly, the work efficiency is further improved.

Since the display process and the editing process of the design data can be designated in accordance with the target of the design stages, the effect that there is no reference to extra information relating to the work is further enhanced.

Since the display process and the editing process of the design data of the design stages are decided dynamically, the apparatus can cope with a change of the design work flexibly.

The continuity of the short-term work for the interruption and the resumption of the work and the long-term continuity of the past work and the current work are also maintained by the work procedure file. Similarly, the design data and the design stage defined previously to a certain extent can be prepared in accordance with the classification of a product, and accordingly the work efficiency is improved.

What is claimed is:

1. A design supporting apparatus for supporting design work including a plurality of design stages, comprising:

memory means for storing said plurality of design stages and design data corresponding to said plurality of design stages, wherein each of said design stages involves an inherent display process and an inherent editing process, and each of said design stages is set by a user so as to increase customizing capabilities within a respective design stage;

display means for simultaneously displaying said design data corresponding to said plurality of design stages;

first input means for entering editing process information indicative of a group of tools for editing said design data corresponding to at least one of said simultaneously displayed design stages and displaying at least one predetermined area on a screen of said display means so as to associate the predetermined area with one of said design data;

output and selection means for outputting and editing process information corresponding to said design stage, for sequentially selecting each of said group of tools;

second input means for entering display process information indicative of a display form of said design data corresponding to said design stage entered by said first input means and displaying said design data on the screen of said display means so as to associate each portion of said design data with one of said simultaneously displayed design stages, wherein said second input means includes a menu for displaying said display process information on a display screen of said display means; and design stage definition file means for storing said editing process information and said display process information including first limitation processing information for limiting constituent elements of said design data, second limitation processing information for spatially limiting said design data, abstraction processing information for abstracting said design data and projection conversion processing information for converting said design data into projection data.

2. A design supporting apparatus according to claim 1, further comprising means including a menu selecting at least one of said plurality of design stages.

3. A design supporting apparatus according to claim 1, further comprising a design stage definition file for storing said display processing information and said editing process information.

4. A design supporting apparatus for supporting design work including a plurality of design stages, comprising:

memory means for storing said plurality of design stages and design data corresponding to one of said plurality of design stages, wherein each of said design stages includes an inherent display process and an inherent editing process, and each of said design stages is set by a user so as to increase customizing capabilities within a respective design stage;

display means for simultaneously displaying said design data corresponding to said plurality of design stages;

first input means for entering editing process information indicative of an editing form of said design data in at least one of said simultaneously displayed design stages including a processing stage and an editing stage of said design data corresponding to at least one of said simultaneously displayed design stages so as to associate the predetermined area with one of the design data;

output and selection means for outputting and editing process information corresponding to said design stages;

second input means for entering display process information indicative of a display form of said design data corresponding to said design stage entered by said first input means so as to associate each portion of said design data with one of the design stages, wherein said second input means includes a menu for displaying said display process information on a display screen of said display means;

design stage definition file means for storing said editing process information and said display process information including first limitation processing information for limiting constituent elements of said design data, second limitation processing information for spatially limiting said design data, abstraction processing information for abstracting said design data and projection conversion processing information for converting said design data into projection data; and display means for displaying said design data and said editing process information on a display screen corresponding to said at least one design stage.

5. A design supporting apparatus according to claim 4, wherein said first input means includes a menu for displaying said editing process information on the display screen of said display means.

6. A design supporting apparatus according to claim 5 wherein said menu includes an item in which said editing process information can be inputted.

7. A design supporting apparatus according to claim 6, wherein said editing process information includes processing information in response to initiation and deletion of an autonomous process for performing desired processing and editing in accordance with a condition of said design data.

8. A design supporting apparatus for supporting design work including a plurality of design stages, comprising:

memory means for storing said plurality of design stages and design data corresponding to said design stages, wherein each of said sign stages includes an inherent display process and an inherent editing process, and each of said design stages is set by a user so as to increase customizing capabilities within a respective design stage;

display means for simultaneously displaying said design data corresponding to said plurality of design stages;

first input means for entering inter-stage relation information indicative of attribute relation between at least partial design stages of said simultaneously displayed design stages and displaying at least one predetermined area on a screen of said display means so as to associate the predetermined area with one of said design data;

output means for outputting said design data on the basis of said inter-stage relation information in correspondence to at least one design stage, wherein said display means displays said design data on the display screen on the basks of said inter-stage relation information in correspondence to said at least one design stage;

second input means for entering display process information indicative of a display form of said design data corresponding to said design stage entered by said first input means and displaying said design data on the screen of said display means so as to associate each portion of said design data with one of simultaneously displayed design stages, wherein said second input means includes a menu for displaying said display process information on a display screen of said display means; and design stage definition file means for storing said editing process information and said display process information including first limitation processing information for limiting constituent elements of said design data, second limitation processing information for spatially limiting said design data, abstraction processing information for abstracting said design data and projection conversion processing information for converting said design data into projection data.

9. A design supporting apparatus for supporting design work including a plurality of design stages, comprising:

memory means for storing said plurality of design stages and design data corresponding to said design stages, wherein each of said design stages includes an inherent display process and an inherent editing process, and each of said design stages is set by a user so as to increase customizing capabilities within a respective design stage;

first input means for entering display processing information indicative of a display form of said design data and editing process information indicative of an editing form of said design data in at least one of said plurality of design stages corresponding to at least one of said plurality of design stages so as to associate the predetermined area with one of said design data;

output and selection means for outputting and editing said editing process information corresponding to said design stage;

display means for simultaneously displaying said editing process information and said design data based on said display processing information on a display screen correspondingly to said design stages;

second input means for entering display process information indicative of a display form of said design data corresponding to said design stage entered by said first input means and displaying said design data on the screen of said display means so as to associate each portion of said design data with one of said simultaneously displayed design stages, wherein said second input means includes a menu for displaying said display process information on a display screen of said display means; and design stage definition file means for storing said editing process information and said display process information including first limitation processing information for limiting constituent elements of said design data, second limitation processing information for spatially limiting said design data, abstraction processing information for abstracting said design data and projection conversion processing information for converting said design data into projection data.

10. A design supporting apparatus according to claim 9, wherein said input means includes a first menu for displaying said display processing information on the display screen of said display means and a second menu for displaying said editing process information on the display screen of said display means, such that a user selects a displaying manner at every design stage, respectively.

11. A design supporting apparatus for supporting design work including a plurality of design stages, comprising:

memory means for storing said plurality of design stages and design data corresponding to said design stages, wherein each of said design stages includes an inherent display process and an inherent editing process, and each of said design stages is set by a user so as to increase customizing capabilities within a respective design stage;

first input means for entering display processing information indicative of a display form of said design data editing process information indicative of a group of tools for editing said design data and inter-stage relation information indicative of attribute relation between at least partial design stages in at least one of said plurality of design stages;

output and selection means for outputting and editing process information corresponding to said at least one design stage;

display means for simultaneously displaying said editing processing information and said design data based on said display processing information on a display screen correspondingly to said at least one design stage on the basis of said inter-stage relation information;

second input means for entering display process information indicative of a display form of said design data corresponding to said design stage entered by said first input means and displaying said design data on the screen of said display means so as to associate each portion of said design data with one of said simultaneously displayed design stages, wherein said second input means includes a menu for displaying said display process information on a display screen of said display means; and design stage definition file means for storing said editing process information and said display process information including first limitation processing information for limiting constituent elements of said design data, second limitation processing information for spatially limiting said design data, abstraction processing information for abstracting said design data and projection conversion processing information for converting said design data into projection data.

12. A design supporting apparatus according to claim 11, wherein said first input means includes a first menu for displaying said display processing information on the display screen of said display means, a second menu for displaying said editing process information on the display screen of said display means and a third menu for displaying said inter-stage relation information on the display screen of said display means.

13. A design supporting apparatus according to claim 11, further comprising means for displaying a plurality of areas on the display screen of said display means to associate each of said areas with one of said design stages in response to an indication on the menu.

14. A design supporting means according to claim 12, further comprising a work procedure file, for storing work procedure data corresponding to the design work including said display processing information, said editing process information and said inter-stage relation information.

15. A design supporting apparatus according to claim 14, further comprising retrieval means for retrieving the work procedure data corresponding to desired design work from said work procedure file.

16. A design supporting apparatus according to claim 15, wherein at least a part of said work procedure data retrieved by said retrieval means is displayed in at least associated one of said first to third menus.

17. A design supporting method of supporting design work including a plurality of design stages by means of a computer, said method comprising the steps of:

storing said plurality of design stages and design data corresponding to said design stages, wherein each of said design stages includes an inherent display process and an inherent editing process, and each of said design stages is set by a user so as to increase customizing capabilities within a respective design stage;

simultaneously displaying said design data corresponding to said design stages;

entering editing process information indicative of a group of tools for editing said design data in at least one of said simultaneously displayed design stages; and outputting and editing process information in correspondence to said design stages, for sequentially selecting each of said group of tools;

entering display process information indicative of a display form of said design data corresponding to said entered design stage and displaying said design data on a screen of display means so as to associate each portion of said design data to one of said simultaneously displayed design stages, wherein said step of entering display process information further includes displaying said display process information in a menu on a screen of said display means; and storing said editing process information and said display process information including first limitation processing information for limiting constituent elements of said design data, second limitation processing information for spatially limiting said design data, abstraction processing information for abstracting said design data and projection conversion processing information for converting said design data into projection data.

18. A design supporting method of supporting design work including a plurality of design stages by means of a computer, said method including the steps of:

storing said plurality of design stages and design data corresponding to said design stages, wherein each of said design stages includes an inherent display process and an inherent editing process, and each of said design stages is set by a user so as to increase customizing capabilities within a respective design stage;

entering display processing information indicative of a display form of said design data in said design stages;

simultaneously displaying, on a display device, said design data on the basis of said displayed processing information in correspondence to said design stage;

outputting and editing process information corresponding to said simultaneously displayed design stages;

entering display process information indicative of a display form of said design data corresponding to said design stages and displaying said design data on a screen of display means so as to associate each portion of said design data to one of said simultaneously displayed design stages, wherein said step of entering display process information further includes displaying said display process information in a menu on a screen of said display means; and storing said editing process information and said display process information including first limitation processing information for limiting constituent elements of said design data, second limitation processing information for spatially limiting said design data, abstraction processing information for abstracting said design data and projection conversion processing information for converting said design data into projection data.

19. A design supporting method of supporting design work including a plurality of design stages by means of a computer, said method comprising the steps of:

storing said plurality of design stages and design data corresponding to said design stages, wherein each of said design stages includes an inherent display process and inherent editing process, and each of said design stages is set by a user so as to increase customizing capabilities within a respective design stage;

entering editing process information indicative of an editing form of said design data in said design stages;

outputting and editing process information corresponding to said design stages;

simultaneously displaying said design data and said editing process information on a display screen in correspondence to said simultaneously displayed design stages;

entering display process information indicative of a display form of said design data corresponding to said entered design stage and displaying said design data on a screen of display means so as to associate each portion of said design data to one of said simultaneously displayed design stages, wherein said step of entering display process information further includes displaying said display process information in a menu on a screen of said display means; and storing said editing process information and said display process information including first limitation processing information for limiting constituent elements of said design data, second limitation processing information for spatially limiting said design data, abstraction processing information for abstracting said design data and projection conversion processing information for converting said design data into projection data.

20. A design supporting method according to claim 19, wherein said entering step includes a step of displaying said editing process information in a menu on the display screen.

21. A design supporting method according to claim 20, further comprising a step of displaying a plurality of areas on the display screen to associate each of said areas with one of said design stages in response to an indication on the menu.

22. A design supporting method according to claim 20, wherein said menu includes an area in which said editing process information can be inputted.

23. A design supporting method according to claim 19, wherein said editing process information includes processing information in response to an initiation and deletion of an autonomous process for performing desired processing and editing in accordance with a condition of said design data.

24. A design supporting method of supporting design work including a plurality of design stages by means of a computer, said method comprising the steps of:

storing said plurality of design stages and design data corresponding to said design stages, wherein each of said design stages includes an inherent display process and an inherent editing process, and each of said design stages is set by a user so as to increase customizing capabilities within a respective design stage;

simultaneously displaying said design data corresponding to said design stages;

entering inter-stage relation information indicative of attribute relation between at least partial design stages of said design stages;

outputting said design data on the basis of said inter-stage relation information in correspondence to said simultaneously displayed design stages;

entering display process information indicative of a display form of said design data corresponding to said entered design stage and displaying said design data on a screen of display means so as to associate each portion of said design data to one of said design stages, wherein said step of entering display process information further includes displaying said display process information in a menu on a screen of said display means; and storing said editing process information and said display process information including first limitation processing information for limiting constituent elements of said design data, second limitation processing information for spatially limiting said design data, abstraction processing information for abstracting said design data and projection conversion processing information for converting said design data into projection data.

25. A design supporting method according to claim 24, wherein said outputting step comprises a step of displaying said design data on a display screen on the basis of said inter-stage relation information correspondingly to said at least one design stage.

26. A design supporting method of supporting design work including a plurality of design stages by means of a computer, said method comprising the steps of:

storing said plurality of design stages and design data corresponding to said design stages, wherein each of said design stages includes an inherent display process and an inherent editing process, and each of said design stages is set by a user so as to increase customizing capabilities within a respective design stage;

entering display processing information indicative of a display form of said design data and editing process information indicative of an editing form of said design data in said design stages;

simultaneously displaying said editing process information and said design data based on said display processing information on a display screen correspondingly to said design stages;

outputting and editing process information corresponding to said simultaneously displayed design stages;

entering display process information indicative of a display form of said design data corresponding to said entered design stage and displaying said design data so as to associate each portion of said design data to one of said simultaneously displayed design stages, wherein said step of entering display process information further includes displaying said display process information in a menu on a screen of said display means; and storing said editing process information and said display process information including first limitation processing information for limiting constituent elements of said design data, second limitation processing information for spatially limiting said design data, abstraction processing information for abstracting said design data and projection conversion processing information for converting said design data into projection data.

27. A design supporting method according to claim 26, wherein said first entering step includes a step of displaying said display processing information in a first menu on the display screen and a step of displaying said editing process information in a second menu on the display screen.

28. A design supporting method of supporting design work including a plurality of design stages by means of a computer, said method comprising the steps of:

storing said plurality of design stages and design data corresponding to said design stages, wherein each of said design stages includes an inherent display process and an inherent editing process, and each of said design stages is set by a user so as to increase customizing capabilities within a respective design stage;

entering display processing information indicative of a display form of said design data, editing process information indicative of an editing form of said design data and inter-stage relation information indicative of attribute relation between at least partial design stages in said plurality of design stages;

simultaneously displaying said editing process information and said design data based on said display processing information on a display screen correspondingly to said design stages on the basis of said inter-stage relation information;

entering display process information indicative of a display form of said design data corresponding to said entered design stage and displaying said design data so as to associate each portion of said design data to said simultaneously displayed design stages, wherein said step of entering display process information further includes displaying said display process information in a menu on a screen of said display means; and storing said editing process information and said display process information including first limitation processing information for limiting constituent elements of said design data, second limitation processing information for spatially limiting said design data, abstraction processing information for abstracting said design data and projection conversion processing information for converting said design data into projection data.

29. A design supporting method according to claim 28, wherein said first entering step includes a step of displaying said display processing information in a first menu on the display screen, a step of displaying said editing process information in a second menu on the display screen and a step of displaying said inter-stage relation information in a third menu on the display screen.

30. A design supporting method according to claim 29, further comprising a step of storing work procedure data including said display processing information, said editing process information and said inter-stage relation information corresponding to the design work.

31. A design supporting method according to claim 28, further comprising a step of displaying a plurality of areas on the display screen to associate each of said areas with one of said design stages in response to an indication on the menu.

32. A design supporting method according to claim 30, further comprising a step of retrieving said work procedure data including said display processing information said editing process information and said inter-stage relation information corresponding to desired design work.

33. A design supporting method according to claim 32, wherein at least a part of said work procedure data retrieved by said retrieving means is displayed in at least one of said first to third menus.

* * * * *